US008297986B2

(12) United States Patent
Too et al.

(10) Patent No.: US 8,297,986 B2
(45) Date of Patent: Oct. 30, 2012

(54) INTEGRATED CIRCUIT SOCKET

(75) Inventors: Seah Sun Too, San Jose, CA (US); Raj N. Master, San Jose, CA (US); Jacquana Diep, San Jose, CA (US); Mohammad Khan, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1085 days.

(21) Appl. No.: 11/687,529

(22) Filed: Mar. 16, 2007

(65) Prior Publication Data

US 2008/0227310 A1    Sep. 18, 2008

(51) Int. Cl.
*H01R 12/00* (2006.01)
(52) U.S. Cl. .......................................... 439/70
(58) Field of Classification Search ............... 439/73, 439/66, 331; 361/719, 720
See application file for complete search history.

(56) References Cited

U.S. PATENT DOCUMENTS

| | | | |
|---|---|---|---|
| 4,918,513 A * | 4/1990 | Kurose et al. ............ | 439/73 |
| 5,256,080 A | 10/1993 | Bright | |
| 6,011,304 A | 1/2000 | Mertol | |
| 6,654,250 B1 * | 11/2003 | Alcoe ..................... | 361/719 |
| 6,743,026 B1 * | 6/2004 | Brodsky .................. | 439/73 |
| 6,748,350 B2 | 6/2004 | Rumer et al. | |
| 6,848,172 B2 | 2/2005 | Fitzgerald et al. | |
| 6,848,610 B2 | 2/2005 | Liu | |
| 6,867,978 B2 | 3/2005 | Whittenburg et al. | |
| 6,870,258 B1 | 3/2005 | Too | |
| 6,882,535 B2 | 4/2005 | Labanok et al. | |
| 6,924,170 B2 | 8/2005 | Ravi et al. | |
| 6,934,154 B2 | 8/2005 | Prasher et al. | |
| 6,936,501 B1 * | 8/2005 | Too et al. ............... | 438/122 |
| 6,987,317 B2 | 1/2006 | Pike | |
| 6,989,586 B2 | 1/2006 | Agraharam et al. | |
| 7,009,289 B2 | 3/2006 | Hu et al. | |
| 7,012,011 B2 | 3/2006 | Chrysler et al. | |
| 7,014,093 B2 | 3/2006 | Houle et al. | |
| 7,015,073 B2 | 3/2006 | Houle et al. | |
| 7,344,919 B2 * | 3/2008 | McAllister et al. ........ | 438/108 |
| 2001/0036063 A1 * | 11/2001 | Nagaya et al. ............ | 361/729 |
| 2002/0176229 A1 | 11/2002 | Derian et al. | |
| 2003/0214800 A1 | 11/2003 | Dibene, II et al. | |
| 2004/0009682 A1 * | 1/2004 | Suzuki et al. ............ | 439/73 |
| 2007/0072450 A1 * | 3/2007 | McAllister et al. ........ | 439/73 |

OTHER PUBLICATIONS

Seah Sun Too et al.; Reduction of Damage to Thermal Interface Material Due to Asymmetrical Load; U.S. Appl. No. 11/462,993, filed Aug. 7, 2006.
PCT/US2008/003465 International Search Report.

\* cited by examiner

*Primary Examiner* — Vanessa Girardi
(74) *Attorney, Agent, or Firm* — Ditthavong Mori & Steiner, P.C.

(57) ABSTRACT

Various sockets for packaged integrated circuits and methods of making the same are provided. In one aspect, a method of mounting a semiconductor chip is provided that includes providing a package that has a base substrate with a first side and a second side opposite the first side. The second side has a central region. The package includes a semiconductor chip and a lid coupled to the first side. A socket is provided for receiving the base substrate. The socket includes a mound that projects toward the second side of the base substrate when the base substrate is seated in the socket to provide support for the central region of the base substrate. The package is mounted in the socket. The mound provides support for the central region of the base substrate.

28 Claims, 4 Drawing Sheets

INTEGRATED CIRCUIT SOCKET

BACKGROUND OF THE INVENTION

1. Field of the Invention

This invention relates generally to semiconductor processing, and more particularly to integrated circuits, packages and sockets therefor and methods of making the same.

2. Description of the Related Art

In various types of electronic systems, microprocessors and sometimes other types of integrated circuits are often connected to some form of larger printed circuit board, such as a motherboard, daughterboard or other type of a printed circuit board. In some cases, the integrated circuit is connected to the motherboard by direct soldering or other direct mounting techniques. In other cases, a socket is provided on the upper surface of the motherboard that is designed to receive the integrated circuit. For those integrated circuits that consist of some type of package enclosure and some plurality of conductor pins that project from the package, the motherboard socket includes a corresponding plurality of individual socket holes that are arranged spatially to match up with corresponding conductor pins on the integrated circuit package.

In one conventional socket design, the integrated circuit socket consists of a fortress-like structure that has four walls interconnected at four corners. The four walls enclose an interior space that has a bottom surface provided with a plurality of the aforementioned individual sockets spatially arranged to receive respective conductor pins of the integrated circuit. When the integrated circuit package is seated in the socket, structural support for the integrated circuit package is provided by way of the four corners and the walls of the socket. The walls of the socket tend to be relatively narrow when compared to the length and width of the integrated circuit package. Consequently, the structural support for the integrated circuit package is largely confined to the four corners of the integrated circuit package as well as a narrow peripheral band at the edge of the integrated circuit package. One conventional socket design does include four upwardly projecting pillars that project from the bottom surface of the socket to provide limited and spatially confined structural support for small areas of a microprocessor package. However, in the general sense, conventional designs provides little in the way of structural support for integrated circuit packages particularly in the central portions of those packages.

The lack of a centralized support structure for an integrated circuit package in a motherboard socket might not present a difficult problem for integrated circuits if the only downward loads associated with the integrated circuit package consisted of the weight of the package itself. However, conventional designs of integrated circuits frequently require the use of a heatsink of one form or another that is positioned and held tightly on the integrated circuit package by way of a clamping mechanism. The application of a downward clamping force on the integrated circuit package through the heatsink is resisted in the conventional design described herein by the narrow walls and corners of the socket. With little or no central support for the integrated circuit package, the application of the downward clamping force on the heatsink can result in moments acting upon the integrated circuit package substrate. Conventional ceramic integrated circuit package substrates may have sufficient stiffness to resist the action of such moments. However, many currently-available integrated circuit packages utilize a so-called organic substrate, which consists of a one or more laminated layers of polymer materials. Such polymeric substrates have greater flexibility than comparably sized ceramic substrates. Thus, an organic substrate may simply be too flexible to resist the moments associated with the heatsink clamping force. If an organic substrate undergoes excessive flexure, the central portion of the organic substrate may warp downward and produce a tensile loading and an attendant stretching of a thermal interface material interposed between the integrated circuit package lid and the enclosed integrated circuit. For those types of thermal interface materials that utilize a compliant matrix interspersed with aluminum spheres, the stretching can lead to dramatic increases in the spacing between individual aluminum spears. As the spacing between aluminum spheres increases, the thermal conductivity of the thermal interface material may drop off and lead to temperature spiking in the integrated circuit. If the temperature spiking is severe enough, thermal shutdown may occur.

The present invention is directed to overcoming or reducing the effects of one or more of the foregoing disadvantages.

SUMMARY OF THE INVENTION

In accordance with one aspect of the present invention, a method of mounting a semiconductor chip is provided that includes providing a package that has a base substrate with a first side and a second side opposite the first side. The second side has a central region. The package includes a semiconductor chip and a lid coupled to the first side. A socket is provided for receiving the base substrate. The socket includes a mound that projects toward the second side of the base substrate when the base substrate is seated in the socket to provide support for the central region of the base substrate. The package is mounted in the socket. The mound provides support for the central region of the base substrate.

In accordance with another aspect of the present invention, a method of manufacturing is provided that includes providing a circuit board and forming socket on the circuit board. The socket has a surface and a peripheral wall for at least partially supporting a semiconductor chip package thereon. The semiconductor chip package has a central region. The surface of the socket has a mound projecting therefrom to provide support for the central region of the semiconductor chip package.

In accordance with another aspect of the present invention, an apparatus is provided that includes a package that has a base substrate with a first side and a second side opposite the first side. The second side has a central region, a semiconductor chip coupled to the first side and a lid coupled to the first side. A socket is included for receiving the base substrate. The socket has a mound projecting toward the second side of the base substrate when the base substrate is seated in the socket to provide support for the central region of the base substrate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
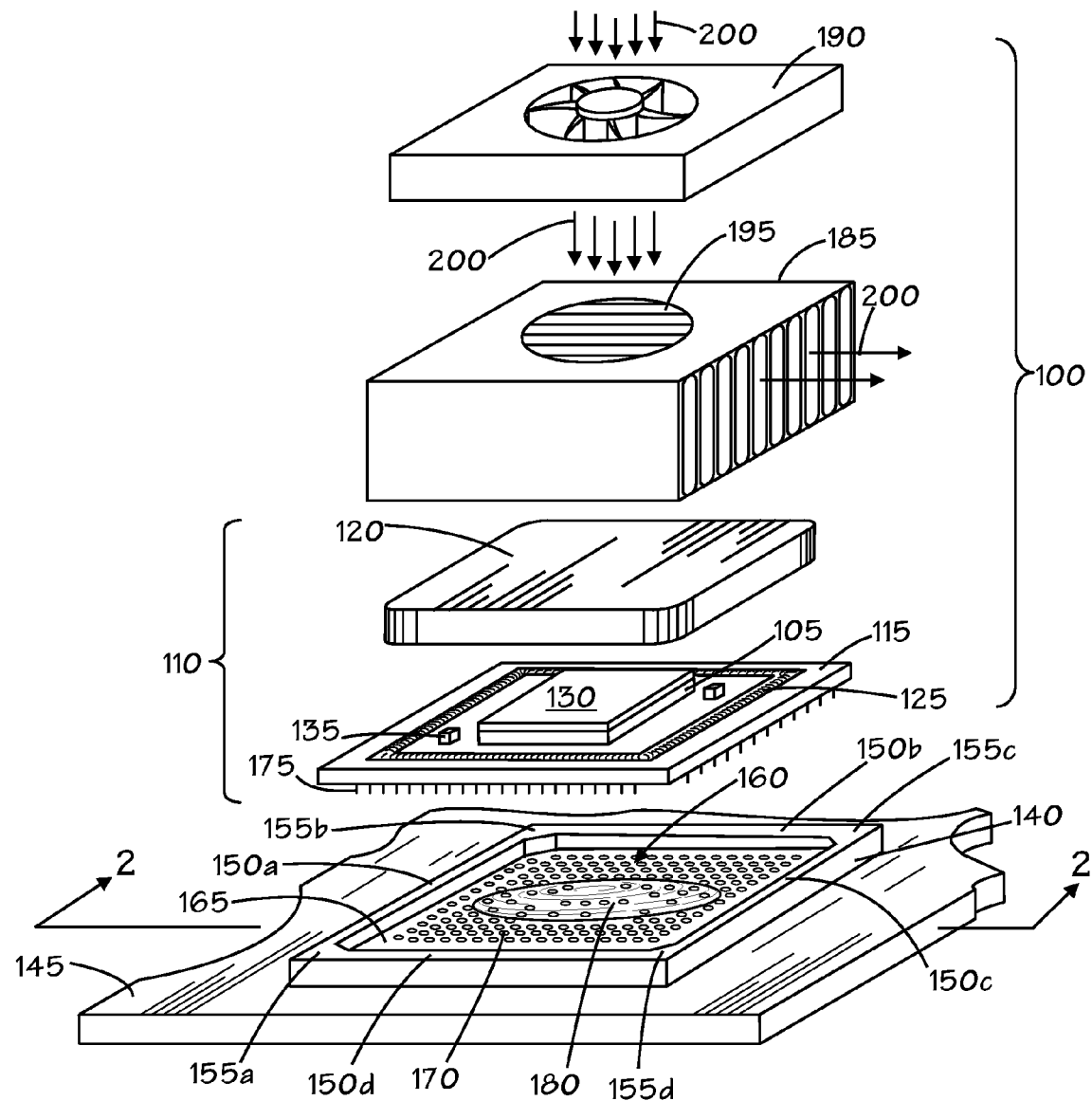
FIG. 1 is an exploded pictorial of an exemplary embodiment of an integrated circuit apparatus.

In the drawings described below, reference numerals are generally repeated where identical elements appear in more than one figure. Turning now to the drawings, and in particular to FIG. 1, therein is shown an exploded pictorial of an integrated circuit apparatus 100 that includes an integrated circuit 105 that is enclosed within an integrated circuit package 110 that includes a base substrate 115 and a lid 120. The integrated circuit 105 may be a semiconductor die or other type of device. The integrated circuit 105 may be any of a myriad of different types of circuit devices used in electronics, such as, for example, microprocessors, graphics processors, application specific integrated circuits, memory devices or the like. The substrate 115 may be composed of well-known plastics, ceramics, or other materials commonly used for integrated circuit packaging.

The lid 120 is secured to the base substrate 115 by way of an adhesive bead 125 that has a general outline that tracks the shape of the perimeter of the overlying lid 120. The integrated circuit 105 is provided with an overlying thermal interface material 130 that is designed to bond with an under surface of the overlying lid 120 and provide an effective conductive heat transfer pathway between the integrated circuit 105 and the lid 120. The thermal interface material 130 is advantageously composed of polymeric materials such as, for example, silicone rubber mixed with aluminum particles and zinc oxide. Optionally, compliant base materials other than silicone rubber and thermally conductive particles other than aluminum may be used. Thermal greases and gold, platinum and silver represent a few examples. In an exemplary embodiment, silicon rubber is mixed with about 60-70% by volume aluminum and about 1-2% by volume zinc oxide. A commercially available product from Shin-etsu may be used.

The package 110 may include one or more external circuit devices, two of which are depicted and one of which is labeled 135. The external devices 135 may be any of a variety of devices such as capacitors, inductors, other logic or the like.

The integrated circuit package 110 is designed to be seated in a socket 140 that is positioned on another printed circuit board, such as the printed circuit board 145. The socket 140 includes a generally rectangular wall that consists of four walls 150a, 150b, 150c and 150d that are integrally connected by way of corners 155a, 155b, 155c and 155d. Together the walls 150a, 150b, 150c and 150d and the corners 155a, 155b, 155c and 155d define an interior space 160 that has a lower surface 165. The lower surface 165 is provided with a plurality of sockets 170 that are designed to receive respective conductor pins 175 that project downwardly from the substrate 115 of the package 110. In a conventional system to be described below, the lower surface 165 is fabricated as a relatively planar surface. However, in this illustrative embodiment, the lower surface 165 of the socket 140 is provided with an upwardly projecting mound 180 that is positioned approximately in the center of the socket 140. The purpose of the mound 180 as described more fully below is to provide a substantial supporting surface for a central region of the base substrate 115 after insertion and clamping of a heat sink thereto. In this illustrative embodiment, the mound 180 is provided with individual sockets 170. It should be understood that the array of sockets 170 is designed to match the array of conductor pins 175 on the substrate 115. There may be more sockets 170 than conductor pins 175.

The socket 140 may be constructed of well-known plastic materials, such as, for example, thermosetting, thermoplastic materials or the like, and formed using well-known molding processes, such as injection molding.

A heat sink 185 is designed to be seated on the upper surface of the lid 120 and an optional cooling fan 190 may be positioned on the heat sink 185. The heat sink 185 is designed to remove heat from the package 110 and may take on a myriad of different configurations. In this embodiment, the heat sink 185 includes an opening 195 through which a flow of air 200 may be moved by the cooling fan 190.

Figure 2:
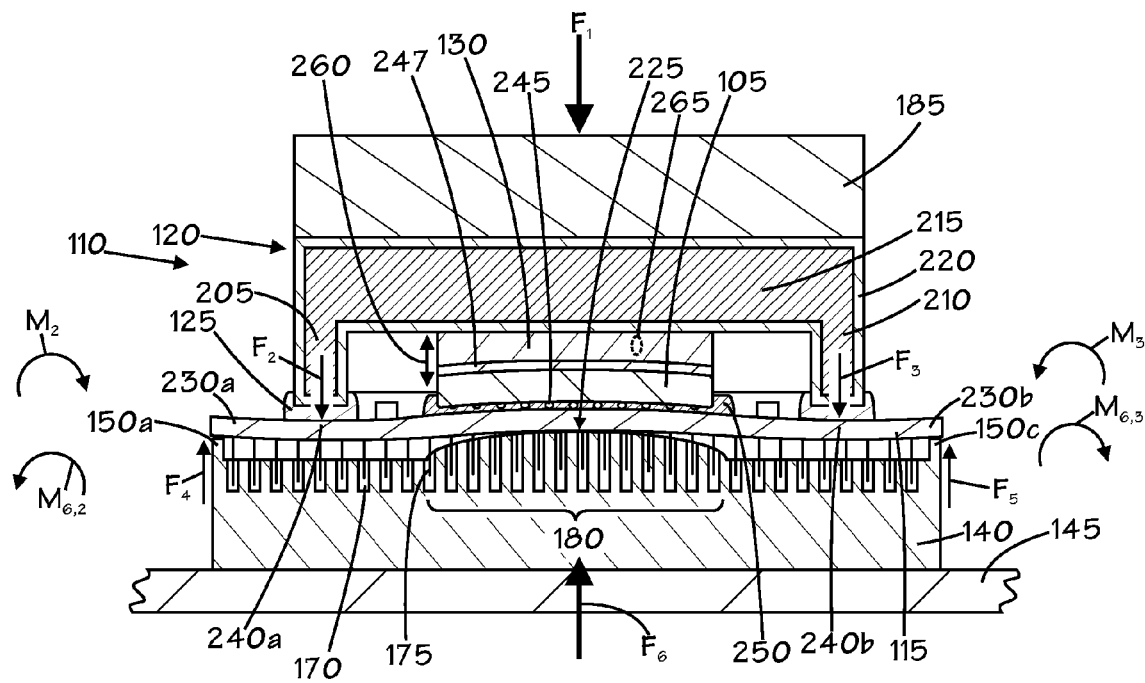
FIG. 2 is a sectional view of FIG. 1 taken at Section 2-2.

Attention is now turned to FIG. 2, which is a sectional view of FIG. 1 taken at Section 2-2. For simplicity of illustration, the optional cooling fan 200 is not depicted. FIG. 2 shows the integrated circuit package 110 seated in the socket 140. The lid 120 has a generally clam shell shaped configuration. In this regard, two of the four downwardly projecting walls of the lid 120 are shown and labeled 205 and 210. The lid 120 may be composed of a unitary piece of material or be outfitted as a jacketed design as shown in which a metallic core 215 is surrounded by a metallic jacket 220. In an exemplary embodiment, the core 215 consists of copper and the jacket 220 consists of nickel. However, other materials may be used for the lid 120, such as anodized aluminum, aluminum-silicon-carbide, aluminum nitride, boron nitride or the like.

The base substrate 115 of the package 110 has a profile at Section 2-2 that, when viewed from the side, is not unlike a recurve bow used in archery. In this regard, there is a general upwardly projecting warping in the central region 225 of the substrate and upward warping at each end 230a and 230b of the substrate 115, as well as a slight downward warping at positions 240a and 240b proximate the locations where the lid 120 is attached to the base substrate 115. The integrated circuit 105 is mounted to the substrate 115 and electrically interconnected thereto by a plurality of solder bumps 245. The integrated circuit 105 may be provided with a backside metallization stack 247 that includes one or more metallic layers. An underfill material 250 is positioned between the integrated circuit 105 and the substrate 115. When the underfill material 250 is cured during fabrication, the upward warping in the region 225 of the base substrate 115 is produced. However, when the lid 120 is seated on the adhesive 125 and an adhesive curing process is performed, the solidification of the adhesive 125 produces the downwardly facing warping in the regions 240a and 240b. This leads to the curious recurve bow profile of the substrate 115. As noted above, the mound 180 may be provided with at least some of the sockets 170 in which the respective conductor pins 175 are seated. While the integrated circuit 105 is depicted in a flip-chip solder mounting arrangement, other types of interconnection and mounting methods may be used.

A description of the forces acting on the substrate 115 of the package 110 will now be presented. After the package 110 is seated in the socket 140, a clamping force $F_1$ is applied to the heat sink 185. This clamping force may be provided by any of a myriad of well-known clamping mechanisms to hold a sink down onto an integrated circuit. It should be understood that although the clamping force $F_1$ is represented schematically as a single resultant force vector, the actual clamping force will consist of a force distribution across some portion of the surface of the heatsink 185. The clamping force $F_1$ is distributed down through and around the entire periphery of the lid 120 and ultimately to the substrate 115. For the present purposes, the propagation of the force $F_1$ into the lid 120 and onto the substrate 115 may be represented graphically by the two downwardly projecting vectors $F_2$ and $F_3$. However, since the lower surfaces of the walls 205 and 210 of the lid 120 have finite widths, it should be understood that $F_2$ is a resultant force at Section 2-2 of the distributed force across the entire width of the wall 205 and the same is true for the resultant force vector $F_3$ and the wall 210. The forces on the substrate 115 in the upward direction are represented by the resultant forces $F_4$ and $F_5$ imposed by the walls 150*a* and 150*c* of the socket 140 as well as the force $F_6$ provided by the mound 180. Again, it should be understood that although the forces $F_4$, $F_5$ and $F_6$ are depicted as point forces, those forces are actually force distributions that are represented mathematically as single upward vectors.

The mound 180 provides a significant upward supporting force $F_6$. If the mound 180 were missing and the central portion 225 of the base substrate 115 were not supported, the downward force $F_2$ acting at a distance from the edge 150*a* would produce a moment $M_2$ and similarly, the downward $F_3$ acting at a distance from the edge 150*b* would produce a moment $M_3$ in the opposite direction. The moments $M_2$ and $M_3$ would cause the substrate 115 to flex downward. If the downward flexure of the substrate 115, particularly in the central region 225 is substantial enough, a tensile force represented schematically by the vector 260 could cause a tensile and/or stretching condition in the thermal interface material 130. However, because of the presence of the mound 180 and the resultant upward force $F_6$, acting at distances from the edges 150*a* and 150*b* to produce a moments or couples M6,2 and M6,3 that counteract the moments $M_2$ and $M_3$, the deflection of the central region 225 that would otherwise be caused by the moments $M_2$ and $M_3$ is lessened.

The mound 180 is advantageously a convex shaped structure. The mound 180 may have a generally circular footprint as shown in FIG. 1, or other type of footprint as desired. The mound 180 should be tall enough to provide support proximate the center region 225 of the base substrate 115.

Figure 3:
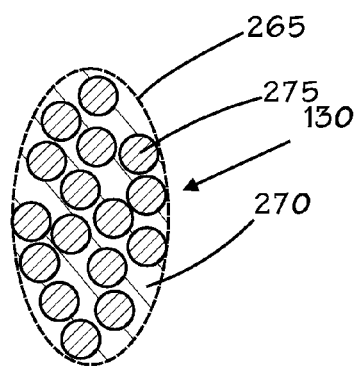
FIG. 3 is a magnified portion of FIG. 2.

A portion of the thermal interface material 130 circumscribed by a dashed oval 265 is shown highly magnified in FIG. 3. As shown in FIG. 3, the thermal interface material 130 may consist of a compliant matrix 270 interspersed with a plurality of aluminum particles 275. A tight packing of the aluminum particles 275 is necessary for the thermal interface material 130 to exhibit a requisite coefficient of thermal conductivity. Consequently, if the thermal interface material 130 is stretched as a result of tensile forces, the particles 275 can become less tightly packed and result in an attendant decrease in the thermal conductivity for the thermal interface material 130. The degree of downward flexure of the central region 225 sufficient to cause worrisome stretching of the thermal interface material 130 may be quite small. This follows from the fact that the thermal interface material 130 may be relatively thin, perhaps on the order of a few tens of microns. An almost imperceptible stretching of just 20 microns represents 100% increase in thickness for a thermal interface with a nominal thickness of 20 microns.

Figure 4:
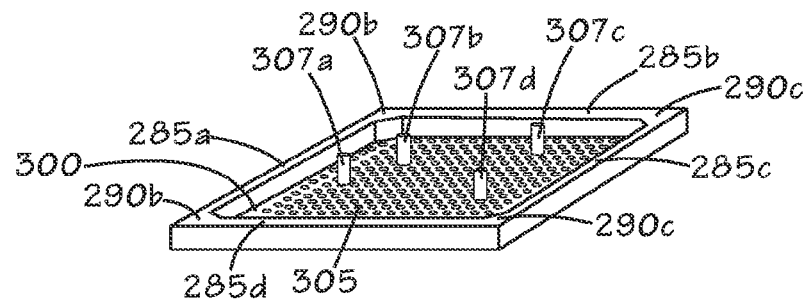
FIG. 4 is a pictorial view of a conventional integrated circuit socket.

It will be useful at this point to contrast the benefits of the disclosed embodiments with a conventional system. In this regard, attention is now turned to FIGS. 4 and 5. FIG. 4 is a pictorial view of a conventional socket 280 that consists of four walls 285*a*, 285*b*, 285*c* and 285*d* connected at integral corners 290*a*, 290*b*, 290*c* and 290*d* so as to define an interior space 295 that has a lower surface 300. The lower surface 300 is provided with a plurality of individual sockets 305 that are designed to receive conductor pins of an integrated circuit. The lower surface 300 is planar with the exception of four small, upwardly projecting pillars 307*a*, 307*b*, 307*c* and 307*d*. The pillars 307*a*, 307*b*, 307*c* and 307*d* are designed to provide a limited support for small areas of an integrated circuit package substrate.

Figure 5:
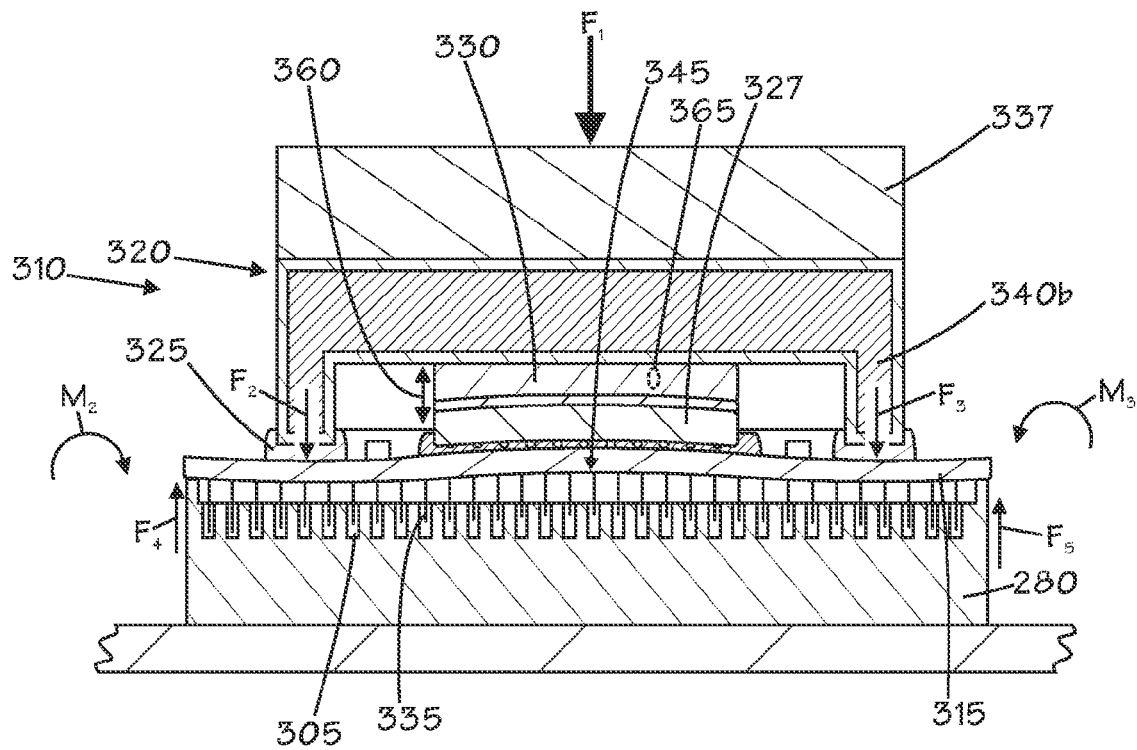
FIG. 5 is a sectional view of a conventional integrated circuit socket with a packaged integrated circuit seated therein.

As shown in FIG. 5, an integrated circuit package 310 is seated in the socket 280. The integrated circuit package 310 consists of an underlying base substrate 315 and an overlying lid 320 that is secured by way of an adhesive 325. An integrated circuit 327 is positioned inside the package 310 and a thermal interface material 330 is positioned between the integrated circuit 327 and the undersurface of the lid 320. In the seated position shown, the conductor pins 335 are positioned and respective of the sockets 305. When a heat sink 337 is seated on the lid 320 and a clamping force represented by the point force $F_1$ is applied thereto, the force $F_1$ is distributed through the lid 320 to the walls 340*a* and 340*b* of the lid 320 and down to the underlying substrate 315 much as was described hereinbefore with regard to the embodiment of FIGS. 1 and 2. Accordingly, downward forces $F_2$ and $F_3$ are imposed upon the substrate 315 by the walls 340*a* and 340*b*. The edges 285*a* and 285*c* of the socket 280 project upwardly and against the substrate 315. The downward forces $F_2$ and $F_3$ produce moments $M_2$ and $M_3$ that cause downward deflection of the moment $F_{3,5}$. The moments $M_2$ and $M_3$ act to cause a bending or flexure of the central portion 345 of the substrate 315. In this conventional design, the central portion 345 of the substrate 315 is largely unsupported, with the exception of the conventional pillars 307*a*, 307*b*, 307*c* and 307*d* that are depicted in FIG. 4. Accordingly, there is little structural support to oppose the moments $M_2$ and $M_3$. Thus, if the substrate 315 is sufficiently flexible, as is the case in many conventional organic substrate designs, the central portion 345 of the substrate 315 can undergo downward flexure and produce a tensile load represented by the vector 360 in the thermal interface material 330.

Figure 6:
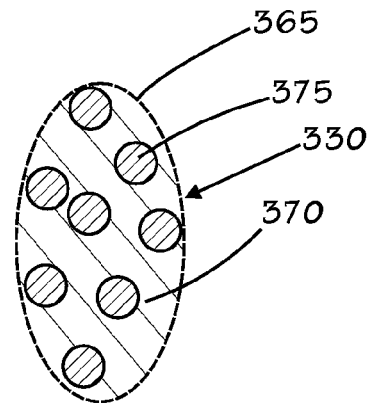
FIG. 6 is a magnified portion of FIG. 5.

To illustrate the impact of the tensile loading 360 on the thermal interface material 330, a small portion of the thermal interface material 330 is circumscribed by a dashed oval 365. That dashed oval 365 is depicted at a higher magnification in FIG. 6. Again the thermal interface material 330 consists of a compliant matrix 370 interspersed with a plurality of aluminum particles 375. However, as a result of the tensile loading 360 depicted in FIG. 5, the thermal interface material 330 is stretched, producing an attendant spreading of the aluminum particles 375. This tends to reduce the thermal conductivity of the thermal interface material 330 and can lead to the thermal runaway problem discussed in the Background section hereof.

Figure 7:
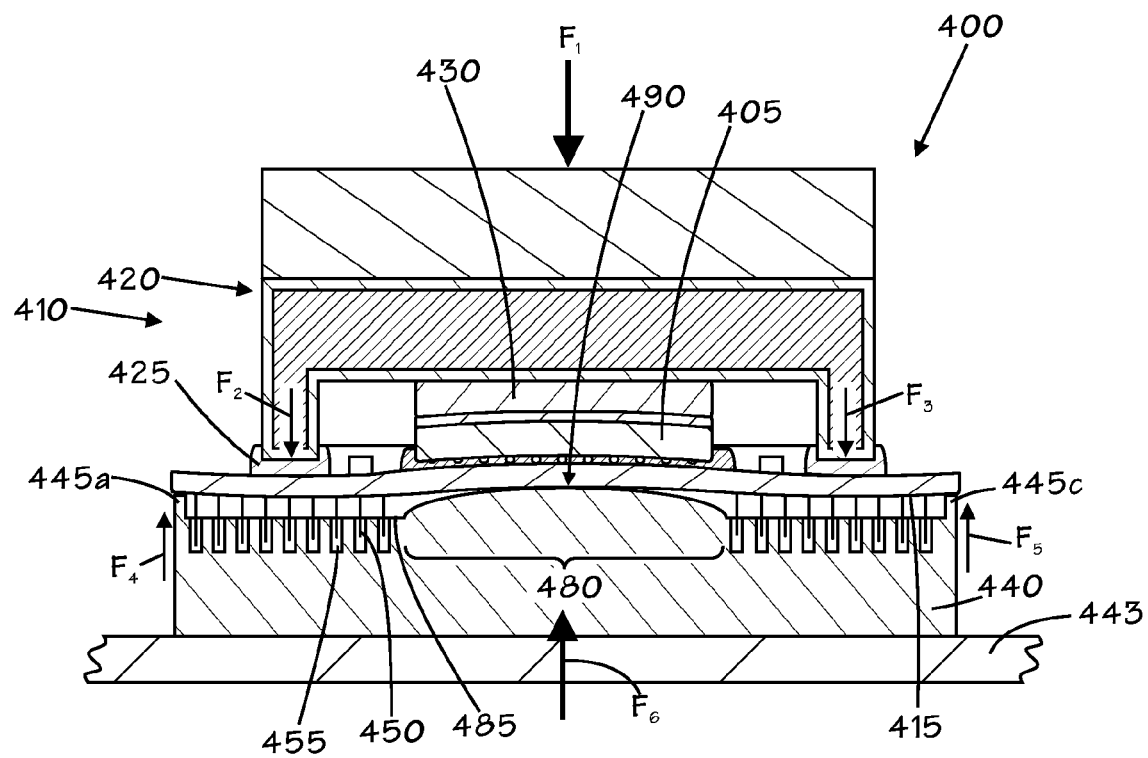
FIG. 7 is a sectional view of an alternate exemplary embodiment of an integrated circuit apparatus.

An alternate exemplary embodiment of an integrated circuit apparatus in accordance with aspects of the present invention may be understood by referring to FIG. 7, which is a sectional view like FIG. 2. The apparatus 400 may include an integrated circuit 405 enclosed within a package 410 that includes a base substrate 415 and an overlying lid 420. The lid 420 may be secured to the substrate 415 by way of an adhesive bead 425. The lid 420 may be substantially identical to the lid 120 disclosed elsewhere herein. A thermal interface material 430 is interposed between the integrated circuit 405 and an undersurface of the lid 420. The package 410 is shown seated in a socket 440 on a printed circuit board 443 that may be substantially the same as the socket 140 depicted in FIGS. 1 and 2 with a few notable exceptions. The socket 440 may include walls like the embodiment of FIG. 1. In this regard, two walls 445*a* and 445*c* are depicted. Furthermore, the socket 440 includes a plurality of individual sockets 455 that are designed to receive respective conductor pins 450 of the integrated circuit package 410. As noted elsewhere herein, it is desirable for the array of individual sockets 455 of the socket 440 to match the array of the conductor pins 450 on the substrate 415. In this regard, a mound 480 is provided in the lower surface 485 of the socket 440. However, the mound 480 is not provided with any sockets to receive conductor pins 450 of the substrate 415. This embodiment may be appropriate where the pin array of the package 410 does not include conductor pins in a central region 490 of the substrate 415. However, this embodiment provides the same useful upwardly projecting force $F_6$ as the other embodiment disclosed herein that counteracts moments produced by the action of the downward clamping force $F_1$ and the distributive forces $F_2$ and $F_3$. Excessive downward warping of the central portion 490 of the substrate 415 may be avoided.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of mounting a semiconductor chip, comprising:
   providing a package including a base substrate having a first side and a second side opposite the first side, the second side having a central region, a semiconductor chip coupled to the first side and a lid coupled to the first side;
   providing a socket for receiving the base substrate, the socket including a mound projecting toward and adapted to physically contact the second side of the base substrate when the base substrate is seated in the socket to provide structural support for the central region of the base substrate; and
   mounting the package in the socket, the mound providing support for the central region of the base substrate.

2. The method of claim 1, wherein the providing the socket comprises forming the mound with a circular footprint.

3. The method of claim 1, wherein the providing the socket comprises forming the mound with a convex shape.

4. The method of claim 1, wherein the providing the socket comprises providing the socket with a plurality of pin sockets.

5. The method of claim 4, wherein some of the plurality of pin sockets are positioned in the mound.

6. The method of claim 4, wherein none of the plurality of pin sockets is positioned in the mound.

7. The method of claim 1, wherein the providing the package including a semiconductor chip comprises providing a microprocessor.

8. The method of claim 1, comprising providing a thermal interface material between the semiconductor chip and the lid.

9. The method of claim 8, wherein the thermal interface material comprises a silicone matrix interspersed with aluminum particles.

10. The method of claim 1, comprising coupling a printed circuit board to the socket.

11. A method of manufacturing, comprising:
    providing a circuit board;
    forming socket on the circuit board, the socket having a surface and a peripheral wall for at least partially supporting a semiconductor chip package thereon, the semiconductor chip package having a central region, the surface of the socket having a mound projecting therefrom adapted to physically contact and provide support for the central region of the semiconductor chip package.

12. The method of claim 11, wherein the forming of the socket comprises injection molding a plastic material.

13. The method of claim 11, wherein the peripheral wall comprises a rectangular footprint.

14. The method of claim 11, wherein the forming of the socket comprises forming the mound with a circular footprint.

15. The method of claim 11, wherein the forming of the socket comprises forming the mound with a convex shape.

16. The method of claim 11, wherein the forming of the socket comprises forming a plurality of pin sockets in the socket.

17. The method of claim 16, wherein some of the plurality of pin sockets are positioned in the mound.

18. The method of claim 16, wherein none of the plurality of pin sockets is positioned in the mound.

19. An apparatus, comprising:
    a package including a base substrate having a first side and a second side opposite the first side, the second side having a central region, a semiconductor chip coupled to the first side and a lid coupled to the first side; and
    a socket for receiving the base substrate, the socket including a mound projecting toward and adapted to physically contact the second side of the base substrate when the base substrate is seated in the socket to provide support for the central region of the base substrate.

20. The apparatus of claim 19, wherein the mound has a circular footprint.

21. The apparatus of claim 19, wherein the mound has a convex shape.

22. The apparatus of claim 19, wherein the socket comprises a plurality of pin sockets.

23. The apparatus of claim 22, wherein some of the plurality of pin sockets are positioned in the mound.

24. The apparatus of claim 22, wherein none of the plurality of pin sockets is positioned in the mound.

25. The apparatus of claim 19, wherein the semiconductor chip comprises a microprocessor.

26. The apparatus of claim 19, comprising a thermal interface material positioned between the semiconductor chip and the lid.

27. The apparatus of claim 26, wherein the thermal interface material comprises a silicone matrix interspersed with aluminum particles.

28. The apparatus of claim 19, comprising a printed circuit board coupled to the socket.

* * * * *